(12) United States Patent
Beach et al.

(10) Patent No.: US 8,431,960 B2
(45) Date of Patent: Apr. 30, 2013

(54) DOPANT DIFFUSION MODULATION IN GAN BUFFER LAYERS

(75) Inventors: Robert Beach, La Crescenta, CA (US); Guang Yuan Zhao, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 362 days.

(21) Appl. No.: 12/756,063

(22) Filed: Apr. 7, 2010

(65) Prior Publication Data
US 2010/0258912 A1  Oct. 14, 2010

Related U.S. Application Data

(60) Provisional application No. 61/167,820, filed on Apr. 8, 2009.

(51) Int. Cl.
*H01L 29/66* (2006.01)
(52) U.S. Cl.
USPC ............ 257/192; 257/615; 257/E21.403; 257/E29.246; 438/478
(58) Field of Classification Search .............. 438/590
See application file for complete search history.

(56) References Cited

U.S. PATENT DOCUMENTS

| | | | |
|---|---|---|---|
| 2004/0195562 A1* | 10/2004 | Munns | 257/1 |
| 2006/0006414 A1 | 1/2006 | Germain et al. | |
| 2006/0214193 A1* | 9/2006 | Hayamura et al. | 257/213 |
| 2006/0273347 A1 | 12/2006 | Hikita et al. | |
| 2006/0281238 A1* | 12/2006 | Harris et al. | 438/172 |
| 2007/0108456 A1* | 5/2007 | Wong et al. | 257/94 |
| 2008/0220555 A1* | 9/2008 | Saxler et al. | 438/47 |
| 2008/0315243 A1 | 12/2008 | Ueno et al. | |
| 2009/0206371 A1* | 8/2009 | Oka | 257/201 |
| 2010/0025730 A1* | 2/2010 | Heikman et al. | 257/194 |
| 2010/0117118 A1* | 5/2010 | Dabiran et al. | 257/190 |

OTHER PUBLICATIONS

W. S. Chen et al. "$Al_xGa_{1-x}N$/GaN Heterostructure Field Effect Transistors With Various Al Mole Fractions in AlGaN Barrier," *Journal of Crystal Growth* 275, pp. 398-403, 2005.
X. Hu, et al. "Enhancement Mode AlGaN/GaN HFET With Selectively Grown pn Junction Gate", *Electronics Letters*, vol. 36, No. 8 pp. 753-754, Apr. 13, 2000.
T. Fujii et al. High On/Off Ratio in Enhancement-Mode $A_1xGa_{1-x}N$/GaN Junction Heterostructure Field-Effect Transistors With P-Type GaN Gate Contact, *Japanese Journal of Applied Physics*, vol. 45, No. 39, pp. L1048-L1050, 2006.
V. Uemoto et al, Gate Injection Transistor (GIT)—A Normally-Off AlGaN/GAN Power Transistor Using Conductivity Modulation, *IEEE Transactions on Electron Devices*, vol. 54, No. 12, pp. 3393-3389, Dec. 2007.

* cited by examiner

*Primary Examiner* — Michelle Mandala
*Assistant Examiner* — Shaka White
(74) *Attorney, Agent, or Firm* — Dickstein Shapiro LLP

(57) ABSTRACT

An enhancement mode gallium nitride (GaN) transistor with a Mg doped layer and a Mg growth interruption (diffusion barrier) layer to trap excess or residual Mg dopant. The Mg growth interruption (diffusion barrier) layer is formed by growing GaN, stopping the supply of gallium while maintaining a supply of ammonia or other nitrogen containing source to form a layer of magnesium nitride (MgN), and then resuming the flow of gallium to form a GaN layer to seal in the layer of MgN.

11 Claims, 4 Drawing Sheets

DOPANT DIFFUSION MODULATION IN GaN BUFFER LAYERS

CROSS REFERENCE TO RELATED APPLICATIONS

This application claims priority from U.S. Provisional Application No. 61/167,820, filed on Apr. 8, 2009, which is hereby incorporated by reference in its entirety.

FIELD OF THE INVENTION

The present invention relates to the field of gallium nitride (GaN) transistors. In particular, the invention relates to a method and apparatus to trap excess dopants.

BACKGROUND OF THE INVENTION

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages, e.g., 100 Volts, while operating at high frequencies, e.g., 100 kHz-10 GHz.

A GaN HEMT device includes a nitride semiconductor with at least two nitride layers. Different materials formed on the semiconductor or on a buffer layer causes the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because of the 2DEG region existing under the gate at zero gate bias, most nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide. An enhancement mode device requires a positive bias applied at the gate in order to conduct current.

FIG. 1 illustrates a conventional GaN transistor device 100. Device 100 includes substrate 11 composed of silicon (Si), silicon carbide (SiC), sapphire, or other material, transition layers 12 typically composed of aluminum nitride (AlN) and aluminum gallium nitride (AlGaN) that is about 0.1 to about 1.0 µm in thickness, Mg doped GaN layer 10, buffer layer 13 typically composed of GaN that is about 0.5 to about 3 µm in thickness, current conducting region 14 composed of GaN or indium gallium nitride (InGaN) typically about 0.01 to about 0.5 µm in thickness, contact region 15 typically composed of AlGaN, Al and titanium (Ti) that may have Si, typically about 0.01 to about 0.03 µm in thickness, barrier layer 16 typically composed of AlGaN where the Al to Ga ratio is about 0.1 to about 0.5 with a thickness of about 0.01 to about 0.03 µm, gate structure 17 composed of a nickel (Ni) and gold (Au) metal contact, and ohmic contact metals 18, 19 composed of Ti and Al with a capping metal such as Ni and Au.

During growth of Mg doped GaN material in a conventional GaN transistor device (e.g., FIG. 1), magnesium (Mg) is added to the growth environment. This Mg accumulates on the surface of the GaN and becomes part of the crystal. In addition, Mg coats the walls of the growth chamber during this part of the growth. Growth of undoped GaN, with the intention of having material without Mg present, following the growth of Mg doped material is difficult due to the presence of Mg still residing on the surface of the GaN and other Mg on the walls of the chamber. This residual Mg will continue to contaminate the crystal for extended lengths of time as Mg moves easily about the growth chamber.

Conventional GaN transistors have many disadvantages. The breakdown voltage is limited by the width of the gate 17 (as shown in FIG. 1). To reach high voltages, a wide gate and large separation between gate 17 and drain contact 18 is required due to residual n-type doping from oxygen contamination and nitrogen vacancies in the undoped GaN material 13. In addition, conventional GaN transistors using Mg doping in the buffer layer suffer from changes in the conductivity caused by Mg near the barrier layer.

It would be desirable to provide a method and apparatus to achieve the improved breakdown of devices utilizing doped buffers, while eliminating the device performance variations caused by dopants near the barrier layer. To achieve this goal, it is desirable to trap excess dopants in order to avoid the above-mentioned disadvantages of the prior art.

DETAILED DESCRIPTION OF THE INVENTION

In the following detailed description, reference is made to certain embodiments. These embodiments are described with sufficient detail to enable those skilled in the art to practice them. It is to be understood that other embodiments may be employed and that various structural, logical, and electrical changes may be made.

The present invention is a GaN transistor device with a Mg growth interruption layer to trap excess or residual dopants, and a method for making such a device. The invention is designed to force reaction of Mg with nitrogen, for example, to form a less volatile material, i.e., magnesium nitride. This material is then covered by a layer of either GaN or AlGaN. The coating step can be done at lower temperatures as well to assist the coating. By lowering the temperature, less reaction between the MgN and Al or Ga will occur. The reaction of Al and MgN is such that AlN is formed and MgN is reduced to Mg. This reaction is in competition with the desired coating and entrapment of MgN. Thus, Mg will more readily remain in the MgN form if the reaction can be suppressed by reducing the temperature. In the described embodiments, a Column III or Group III element containing gas may be used, including a mixture of one or more of Trimethyl Gallium, Trimethyl Aluminum, Triethyl Gallium, Triethyl Aluminum, and Triethyl Indium. Dopant atoms may be selected from the group consisting of Mg, Fe, Ni, Mn, Ca, V, and other transition metals.

Figure 1:
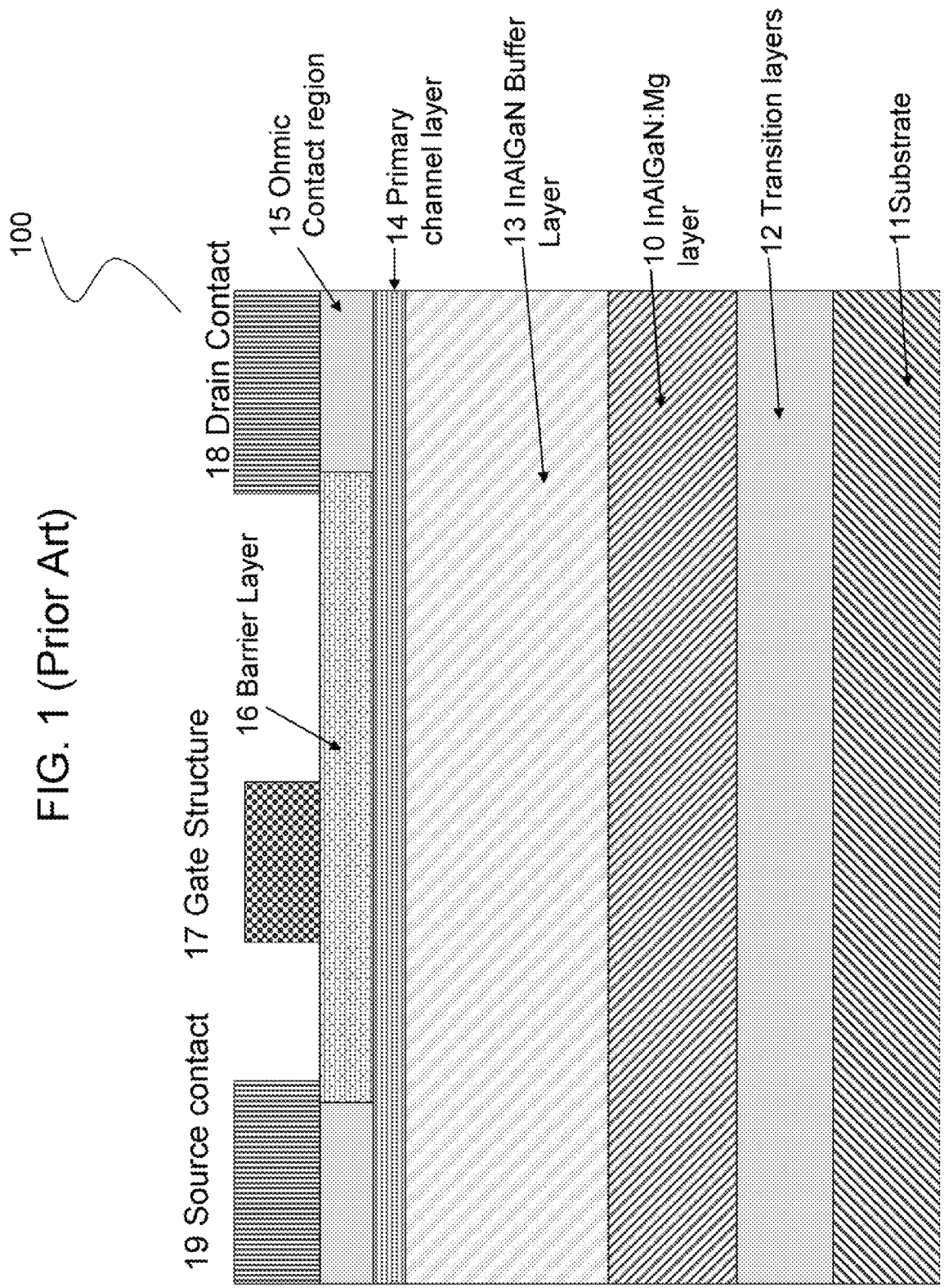
FIG. 1 illustrates a cross-sectional view of a conventional GaN transistor device.
Figure 2:
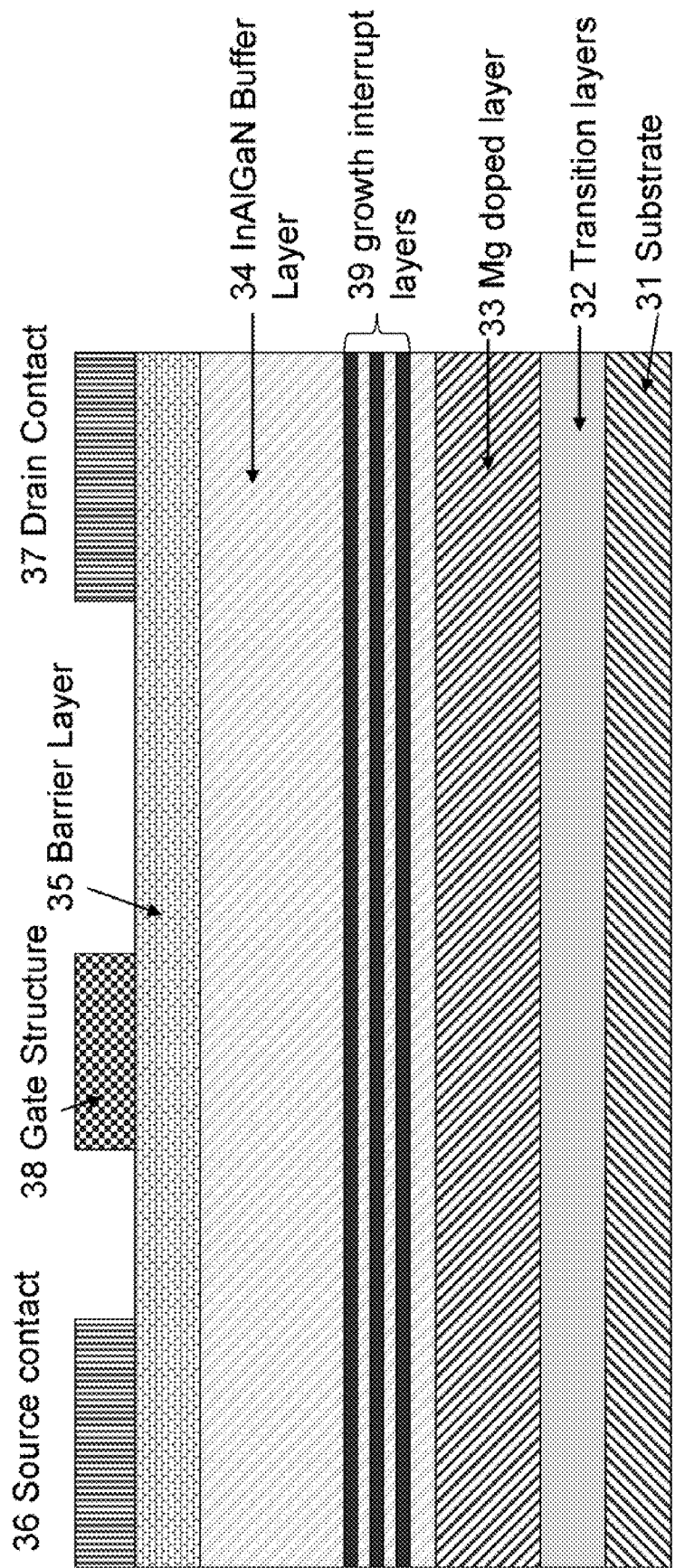
FIG. 2 illustrates a cross-sectional view of an enhancement mode GaN transistor device formed according to a first embodiment of the present invention.

Referring to FIG. 2, a first embodiment is now described with reference to the formation of an enhancement mode GaN transistor. FIG. 2 illustrates a cross-sectional view of the device 200. Device 200 includes, from bottom up, substrate 31, transition layers 32, Mg doped layer 33, growth interrupt layers 39, buffer layer 34, barrier layer 35, ohmic contact metals 36, 37, and gate structure 38. The growth interrupt layers (Mg diffusion barrier) 39 may be composed of one or more layers of highly Mg doped GaN. They are formed by interruption of growth and exposing the surface to ammonia. Other suitable dopants beside Mg may be used, including iron (Fe), nickel (Ni), manganese (Mn), calcium (Ca), vanadium (V), or other transition metals.

Formation of the structure of FIG. 2 will now be described with reference to Mg as the dopant, as an example. The transition layers 32 are formed by nucleation and growth on the substrate 31. Substrate 31 may be composed of silicon (Si), silicon carbide (SiC), sapphire, lithium gallium oxide (LiGaO$_2$), gallium nitride (GaN), or other suitable material. Transition layers 32 may be composed of AlN, AlGaN, InAlGaN, SiO$_2$, SiN, MgO, Al$_2$O$_3$, or combinations of these, preferably about 0.1 to about 1.0 μm in thickness. The transition layers 32 are typically less than about 1000 Å in thickness. Then, the Mg doped layer 33 is grown. The Mg doped layer 33 may be composed of GaN that is about 0.1 to about 1.0 μm in thickness with a Mg concentration between $10^{16}$ atoms per cm$^3$ and $10^{19}$ atoms per cm$^3$. Next, the Mg blocking growth interrupt layers 39 are grown. The formation of the growth interrupt layers 39 consists of growing GaN without Mg-containing material, stopping a supply of Ga-containing materials while maintaining a supply of ammonia or other activated nitrogen source (e.g., plasma N$_2$) to form a layer of magnesium nitride, beginning a supply of Ga to seal in the magnesium nitride layer by growing a layer of GaN, and interrupting growth again and repeating the above sequence until a target level of Mg in the final layer is reached. Next, buffer layer 34, barrier layer 35 and gate structure 38 are grown and material processing occurs to form gate contacts. Buffer layer 34 may be composed of GaN, preferably with a thickness of about 0.5 to about 3.0 μm. Barrier layer 35 may be composed of AlGaN where the Al fraction is about 0.1 to about 0.5, preferably with a thickness between about 0.01 and about 0.03 μm. The Al fraction is the content of Al such that Al fraction plus Ga fraction equals 1. Gate structure 38 may be composed of p-type GaN with a refractory metal contact such as tantalum (Ta), titanium (Ti), titanium nitride (TiN), tungsten (W), or tungsten silicide (WSi$_2$). The gate structure can be simple metal, such as Ni under Au, or a semiconductor with metal such as GaN under TiN, or a semiconductor under insulator under metal such as GaN under SiN under TiN. Other semiconductors could be Si, GaAs, or InAlGaN. Other insulators could be AlGaN, InAlGaN, SiO$_2$, SiN, MgO, Al$_2$O$_3$. Other metals could be Al, Ni, Au, Pt, etc. Also, in place of a metal, polysilicon could be used. The metal and gate layer are each preferably about 0.01 to about 1.0 μm in thickness. Total thickness for the gate structure would preferably be under 1 μm. Next, gate structure 38 is etched in other regions of the device and ohmic contacts 36, 37 are produced. Ohmic contact metals 36, 37 may be composed of titanium (Ti) and aluminum (Al) with a capping metal such as nickel (Ni) and gold (Au) or titanium (Ti) and titanium nitride (TiN). There can also be an implanted highly doped region associated with the contact region. The primary channel region can be n-type doped GaN, or undoped or intrinsic InAlGaN.

In accordance with the above-described method, the addition of a p-type GaN layer 33 below the gate and a series of growth interrupt layers 39 reduces the level of Mg in the GaN buffer layer 34. The Mg doping of layer 33, in FIG. 2, increases the breakdown voltage of the device. The gate length of the device can be greatly reduced without reducing the breakdown voltage of the device. Gate capacitance of the device is reduced due to smaller gate length. Switching speed of the device is improved due to smaller gate capacitance. Growth interrupt layers 39 reduce Mg concentration in layer 34 and near the barrier layer 35.

Figure 3:
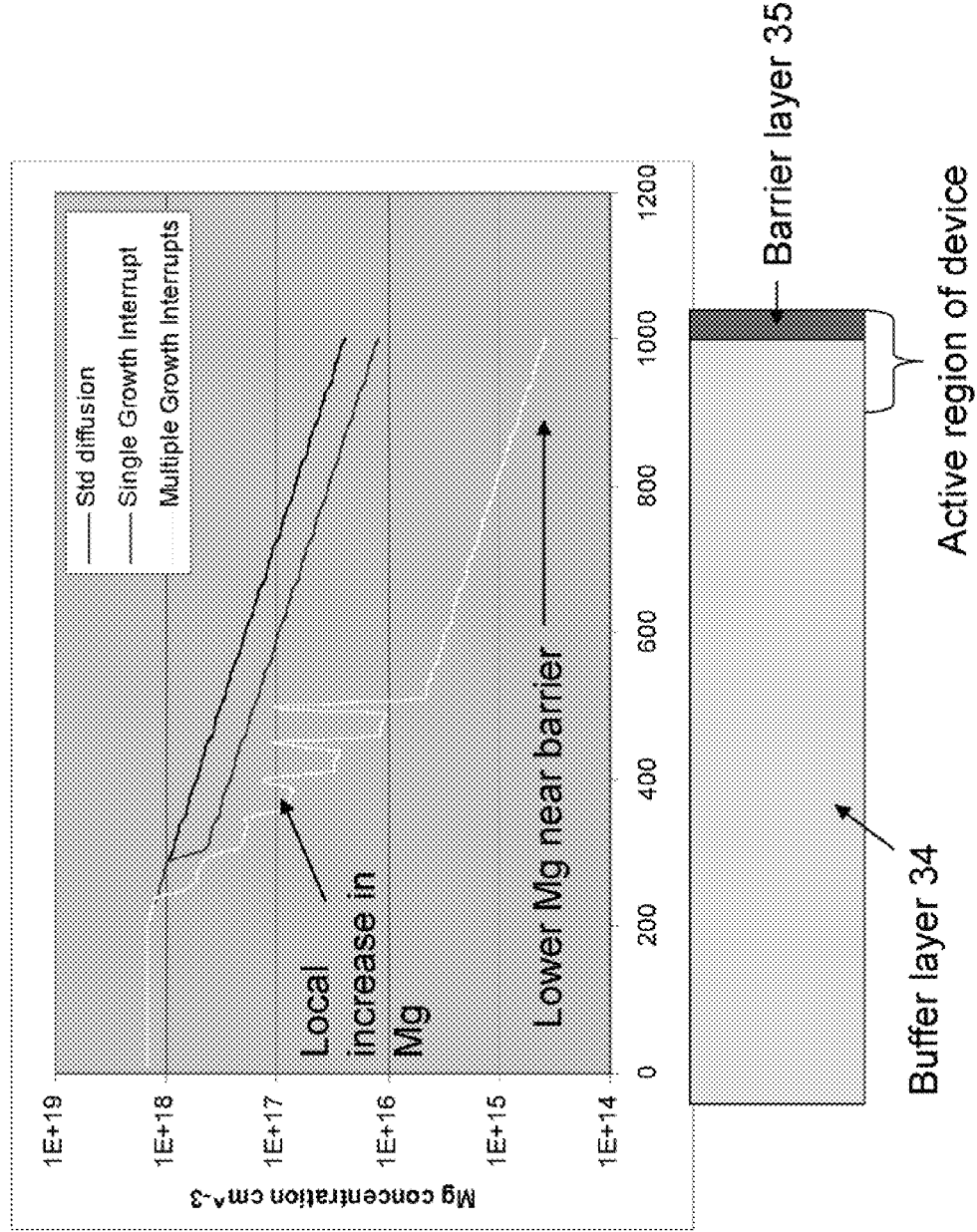
FIG. 3 is a graph of Mg concentration in a buffer layer for single and multiple row interrupts in comparison to non-interrupted or standard growth.

FIG. 3 is a graph comparing the Mg concentration in a buffer layer without growth interrupt layers, a buffer layer with a single growth interrupt layer, and a buffer layer with six growth interrupt layers. As can be seen from the multiple growth interrupt curve, each growth interrupt produces a higher level of Mg at the position of the interrupt, followed by a lower level of Mg in the following layer. Each growth interrupt layer decreases the Mg, and by application of multiple layers, a low level of Mg can be obtained in a smaller distance.

Reduced Mg in layer 34 increases device conductivity. Reduced Mg in layer 34 also allows placement of layer 33 in close proximity to layer 35 without reduction in device conductivity. In addition, close proximity of layer 33 to 35 results in improved device breakdown and lower gate leakage currents. The structure of FIG. 2, however, has some drawbacks. The time required to produce growth interrupt layers 39 can be large, leading to increased cost of fabrication. Additionally, some Mg is still present in layer 34 due to contamination from reactor parts.

Figure 4:
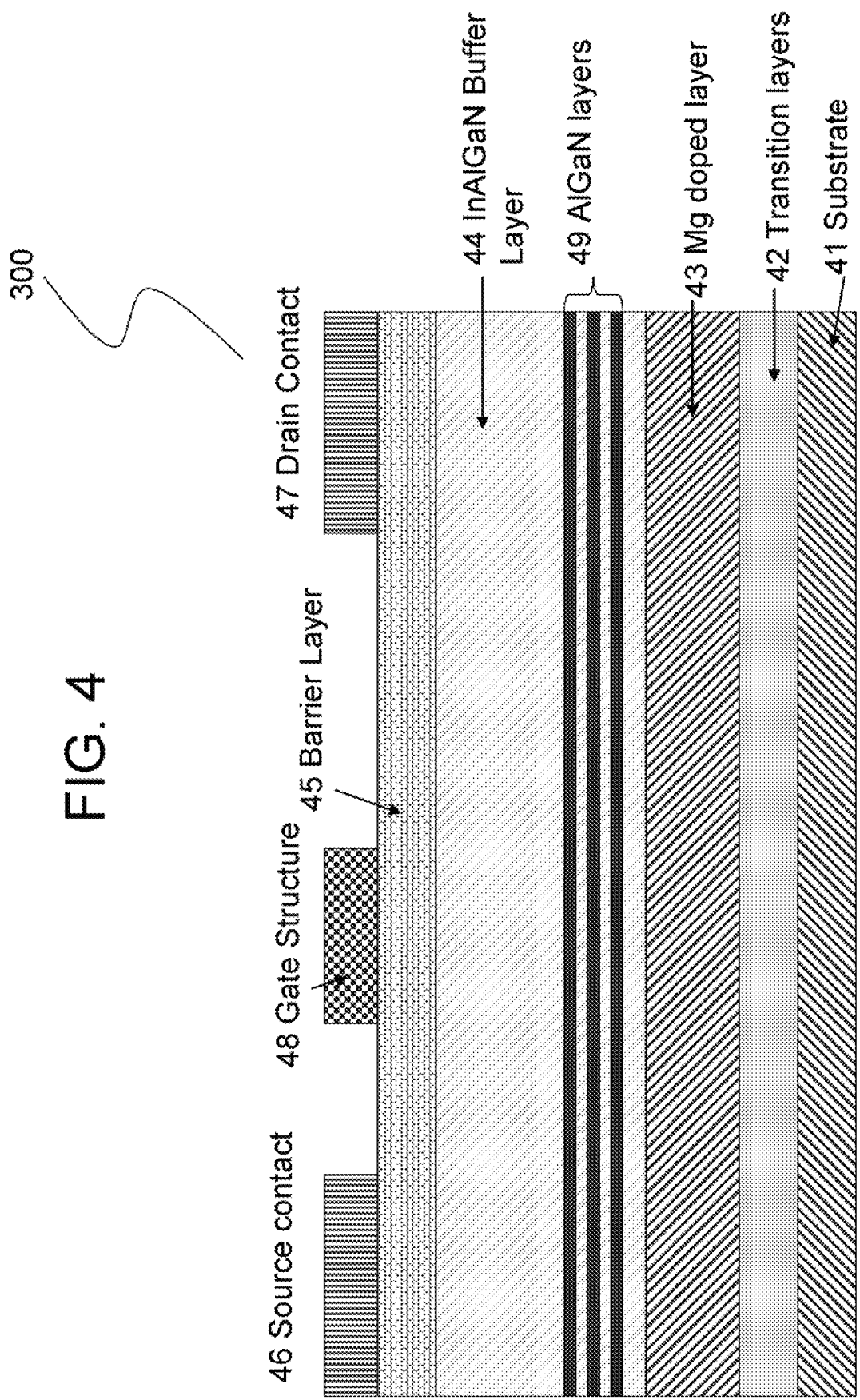
FIG. 4 illustrates a cross-sectional view of an enhancement mode GaN transistor device formed according to a second embodiment of the present invention.

Referring to FIG. 4, a second embodiment is now described with reference to the formation of an enhancement mode GaN transistor. FIG. 4 illustrates a cross-sectional view of the device 300 formed by the method described below. This embodiment of the invention differs from the first embodiment in that the growth interrupt layers 39 of FIG. 2 are now replaced by AlGaN layers 49. The AlGaN layers (doped diffusion barrier) 49 may be composed of one or more layers of AlGaN. They are formed by interruption of growth and exposing the GaN surface to ammonia, similar to the first embodiment, followed by deposition of AlGaN and then GaN. The Al fraction of the AlGaN layers is between about 0.3 and about 1. The thickness of the AlGaN layers is preferably about 0.005 to about 0.03 μm.

Formation of the structure of FIG. 4 is similar to that described above with respect to the first embodiment (FIG. 2), with Mg as the dopant, as an example. The dimensions and compositions of the various layers are similar to that of the first embodiment as well. However, instead of forming growth interrupt layers 39 (FIG. 2), AlGaN layers 49 are formed. The formation of AlGaN layers 49 consists of growing GaN without Mg-containing material, stopping a supply of Ga-containing materials while maintaining a supply of ammonia or other activated nitrogen source (e.g., plasma N$_2$) to form a layer of magnesium nitride, reducing growth temperature, beginning a supply of Al and/or Ga to seal in the magnesium nitride layer by growing a layer of GaN, returning growth temperature to the initial temperature to grow GaN, and interrupting growth again and repeating the above sequence until a target level of Mg in the final layer is reached. The step of reducing the growth temperature and returning to the initial growth temperature is optional.

In accordance with the above-described method, the addition of a p-type GaN layer 43 below the gate and a series of growth interrupt and AlGaN layers 49 reduce the level of Mg in the GaN buffer layer 44. The second embodiment shares the same advantages of the first embodiment. Furthermore, the addition of the AlGaN layers to the diffusion barrier 49 improves the efficiency of each growth interrupt step, reducing the number of steps to achieve a desired level of Mg doping in the buffer layer 44.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

We claim:

1. An enhancement mode gallium nitride (GaN) transistor comprising:
    a substrate;
    a set of transition layers above the substrate;
    a doped layer of material comprising a first concentration of dopant atoms;
    a set of growth interrupt layers above the set of transition layers, wherein said growth interrupt layers contain dopant atoms in a modulated and decreasing concentration, wherein the dopant atoms are selected from the group consisting of magnesium, iron, nickel, manganese, calcium, vanadium, and other transition metals; and
    a buffer layer of material comprising gallium nitride formed above the set of growth interrupt layers.

2. A method of manufacturing an enhancement mode gallium nitride (GaN) transistor, the method comprising:
    forming a set of transition layers over a substrate;
    growing a material doped with magnesium (Mg) over the transition layers;
    starting a flow including a supply of gallium (Ga)-containing material and a supply of a nitrogen source to grow a GaN material over the Mg doped material;
    stopping the supply of Ga-containing material while maintaining the supply of nitrogen source to form an Mg doped nitride material;
    after forming the Mg doped nitride material, resuming the supply of Ga-containing material to form a GaN material over the Mg doped nitride material; and
    forming a buffer layer over the last-formed GaN material.

3. The method of claim 2, further comprising repeating the steps of growing the GaN material, stopping the supply of Ga-containing materials while maintaining a supply of nitrogen source, and resuming the supply of Ga-containing material prior to forming the buffer layer over the last-formed GaN material.

4. A method of manufacturing an enhancement mode gallium nitride (GaN) transistor, the method comprising:
    forming a set of transition layers over a substrate;
    growing a doped material comprising a first concentration of dopant atoms over the transition layers;
    providing a flow of nitrogen and Group III element containing gases;
    stopping flow of Group III element containing gases while maintaining a supply of nitrogen;
    reducing temperature after stopping flow of the Group III element containing gases;
    restarting flow of Group III element containing gases after reducing temperature;
    elevating temperature after restarting the flow of Group III element containing gases; and
    forming a buffer layer.

5. The method of claim 4, wherein the sequence of providing a flow of nitrogen and Group III element containing gases, stop the flow of Group III element containing gases while maintaining a supply of nitrogen, temperature reduction, restarting flow of Group III element containing gases, and temperature elevation are repeated multiple times prior to forming the buffer layer.

6. The method of claim 4, wherein the Group III element containing gas is a mixture of one or more of Trimethyl Gallium, Trimethyl Aluminum, Triethyl Gallium, Triethyl Aluminum, and Triethyl Indium.

7. The method of claim 4, wherein the dopant atoms are selected from the group consisting of magnesium, iron, nickel, manganese, calcium, vanadium, and other transition metals.

8. The method of claim 4, wherein the step of providing a flow of nitrogen and Group III element containing gases comprises:
    growing a GaN material over the doped material; and
    stopping a supply of gallium (Ga)-containing materials while maintaining a supply of an activated nitrogen source to form a doped nitride material.

9. The transistor of claim 1, wherein the dopant atoms comprise magnesium (Mg).

10. The transistor of claim 9, wherein the set of growth interrupt layers comprises alternating layers of GaN and magnesium nitride ($MgN_2$).

11. The transistor of claim 9, wherein the set of growth interrupt layers comprises alternating layers of aluminum gallium nitride (AlGaN) and magnesium nitride ($MgN_2$).

* * * * *